United States Patent
Winslow (10) Patent No.: US 6,803,643 B2
(45) Date of Patent: Oct. 12, 2004

(54) COMPACT NON-LINEAR HBT ARRAY

(75) Inventor: Thomas A. Winslow, Salem, VA (US)

(73) Assignee: M/A-Com, Inc., Lowell, MA (US)

( * ) Notice: Subject to any disclaimer, the term of this patent is extended or adjusted under 35 U.S.C. 154(b) by 0 days.

(21) Appl. No.: 10/260,476

(22) Filed: Sep. 30, 2002

(65) Prior Publication Data

US 2004/0061131 A1 Apr. 1, 2004

(51) Int. Cl.⁷ .................. H01L 27/082; H01L 27/102; H01L 29/70; H01L 31/0328; H01L 31/0336
(52) U.S. Cl. .................. 257/572; 257/197; 257/566; 257/580
(58) Field of Search .................. 257/571–584, 257/566, 197–198

(56) References Cited

U.S. PATENT DOCUMENTS

| | | | |
|---|---|---|---|
| 5,321,279 A | 6/1994 | Khatibzadeh et al. | 257/197 |
| 5,378,922 A | 1/1995 | Sovero | 257/582 |
| 5,608,353 A | 3/1997 | Pratt | 330/295 |
| 5,629,648 A | 5/1997 | Pratt | 330/289 |
| 5,757,046 A * | 5/1998 | Fujihira et al. | 257/339 |
| 5,760,457 A | 6/1998 | Mitsui et al. | 257/582 |
| 5,952,886 A * | 9/1999 | Buer et al. | 330/295 |
| 6,051,871 A | 4/2000 | DeLaCruz et al. | 257/571 |
| 6,130,471 A | 10/2000 | Boles | 257/577 |
| 2003/0164738 A1 * | 9/2003 | Wu et al. | 330/307 |

OTHER PUBLICATIONS

Bloom, M. "HBT Power Amplifiers for RF Wireless Subscriber Applications," pp. 1–33, Motorola SPS, (no publication date).

* cited by examiner

Primary Examiner—Shouxiang Hu (57) ABSTRACT

HBTs in an HBT array are configured non-linearly, i.e., staggered, thus reducing the impact of thermal coupling between adjacent HBTs in the array and bypassing the minimum collector-to-collector spacing design rules required for a linear HBT array. Using this non-linear configuration, adjacent HBTs are misaligned with respect to each other. In a preferred embodiment, adjacent HBTs in the array are configured in a corner-to-corner arrangement, and in a more preferred embodiment, the collectors of the adjacent HBTs are aligned or are common, i.e., the collector of one HBT is shared with the collector of an adjacent HBT. In a most preferred embodiment, the HBTs are ballasted in an emitter-ballast/base-ballast pattern (referred to as "mixed ballasting" or "dual-ballasting").

18 Claims, 7 Drawing Sheets

COMPACT NON-LINEAR HBT ARRAY

FIELD OF THE INVENTION

This invention relates generally to heterojunction bipolar transistors (HBTs), and more particularly, the use of HBTs in an HBT array.

BACKGROUND OF THE INVENTION

An HBT is a well known transistor configuration frequently used in power amplifier circuits. To increase the total power output of an HBT power amplifier, it has become commonplace to connect multiple HBTs in parallel to form a linear HBT array. The term "linear" is used to describe the side-by-side, uniformly aligned arrangement of the HBTs in the array.

The thermal design of an HBT array is critical to reliable operation of the device in which it is used. Several factors contribute to increased temperatures during the operation of the HBT array. An HBT array can be described generally as comprising active regions (the region comprising the HBTs themselves) and inactive or "protective" regions (the areas surrounding the HBTs; essentially the entire array except for the HBTs). The flow of current across the base emitter junction of an HBT dissipates power in the form of heat, causing an increase in the temperature in and around the junction. Elevated junction temperature not only degrades power and gain performance, but it also reduces the device lifetime.

When several HBTs are arranged in a linear array, additional thermal issues arise. HBTs generate heat during normal operation, and that heat is transferred, by thermal coupling, to the inactive region around the HBT. If adjacent HBTs are close enough together, the heat of one HBT can also be transferred to the adjacent HBT(s), causing their temperature to rise. Further, parallel HBTs, although theoretically identical, are typically not truly identical and thus do not have identical heat dissipation capability, resulting in the possibility of having two "identical" HBTs that operate at different operating temperatures.

If one HBT in an HBT array operates even slightly hotter than an adjacent HBT, the hotter HBT begins to carry more current, which results in a further increase in its temperature, which further increases the current it carries. This leads to a runaway condition (known as "thermal runaway") whereby the temperature increases to the point of destruction of the hotter-operating HBT. Once that HBT is destroyed, the remaining HBTs must carry the current load of the destroyed HBT, thereby causing their temperatures to increase as well. Eventually, the entire device will fail.

A generally accepted way of controlling thermal runaway problems in linear HBT arrays is to place a fixed resistance in series with each emitter (referred to as "emitter-ballasting") or each base (referred to as "base-ballasting") of the transistors that are connected in parallel. As is well known, the use of ballasting resistors forces essentially uniform current distribution among the HBTs, thus reducing the likelihood of the occurrence of a runaway condition caused by a lack of uniformity in the heat dissipation characteristic of the HBTs in the array. Examples of emitter-ballasting can be found in, for example, U.S. Pat. No. 6,130,471 to Boles and U.S. Pat. No. 5,378,922 to Sovero, all of which are incorporated herein fully by reference. Examples of base-ballasting can be found in U.S. Pat. No. 5,321,279 to Khatibzadeh et al., U.S. Pat. No. 5,629,648 to Pratt, U.S. Pat. No. 5,608,353 to Pratt, and U.S. Pat. No. 5,760,457 to Mitsui et al., also incorporated herein fully by reference.

To deal with the thermal coupling issue (as well as to prevent collector-to-collector leakage current), designers must leave a minimum amount of space between each HBT in a linear HBT array to increase the size of the inactive region between adjacent HBTs. The typical pitch between HBTs (the distance from the center of one HBT cell to the center of another adjacent cell) is 40–50 $\mu$m. This minimizes the heat transferred from one HBT to another. While this helps reduce the impact of thermal coupling on the operation of the device, it restricts the designer's ability to reduce the overall size of the linear HBT array and thus any components that incorporate linear HBT arrays, since they cannot move the HBTs closer to each other without lowering the performance of the array or violating the collector-to-collector leakage isolation requirements.

Accordingly, it would be desirable to have an HBT array in which the HBT devices could be compacted closer together to achieve a smaller overall device size without increasing the likelihood of damage and/or reduced performance due to thermal coupling, thermal runaway and/or collector-to-collector leakage.

SUMMARY OF THE INVENTION

In accordance with the present invention, HBTs in an HBT array are configured non-linearly, i.e., staggered, thus reducing the impact of thermal coupling between adjacent HBTs in the array and bypassing the minimum collector-to-collector spacing design rules required for a linear HBT array. Using this non-linear configuration, adjacent HBTs are misaligned with respect to each other, rather than being in the aligned, directly side-to-side arrangement of the prior art. In a preferred embodiment, adjacent HBTs in the array are configured in a corner-to-corner arrangement, and in a more preferred embodiment, the collectors of the adjacent HBTs are aligned or are common, i.e., the collector of one HBT is shared with the collector of an adjacent HBT. In a most preferred embodiment, the HBTs are ballasted in an emitter-ballast/base-ballast pattern (referred to as "mixed ballasting" or "dual-ballasting"). (The result is a more compact array of HBTs that exhibit the lower temperature characteristics of ballasted HBTs while also demonstrating a reduced thermal coupling effect on adjacent HBTs.)

Power amplifiers fabricated using the preferred dual ballasted nonlinear HBT arrays are significantly smaller than the typical power amplifiers, with no degradation in thermal resistance or operating junction temperatures.

DETAILED DESCRIPTION OF THE INVENTION

Figure 1:
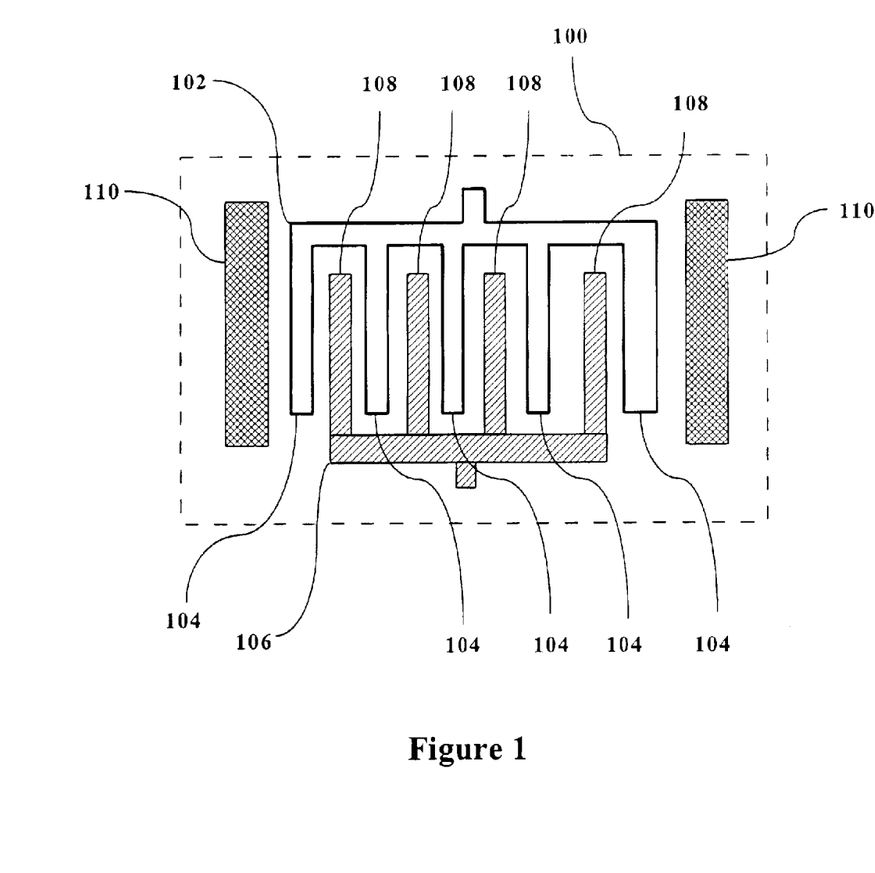
FIG. 1 illustrates the basic structure of a typical HBT.

In order to better understand the present invention, it is helpful to have an understanding of the basic configuration of an HBT and of ballasted HBTs according to the prior art. FIG. 1 illustrates the basic structure of a typical prior art HBT 100. In this example, five base fingers 104 are joined at a base 102; four emitter fingers 108 are situated between base fingers 104 and are joined at emitter 106; and collector electrodes 110 are situated on either side of the base and emitter. The device shown in FIG. 1 can be fabricated using well known processing steps, such as implant or mesa isolation techniques, wet and/or dry etching, metal deposition, and ohmic contact formation, and it is understood that while the above-descriptions and descriptions used herein are two-dimensional in nature, it is well known that transistor fabrication is a three-dimensional endeavor involving layering of deposit materials and the like. The fabrication technique used is not considered one of the novel aspects of the present invention.

Figure 2:
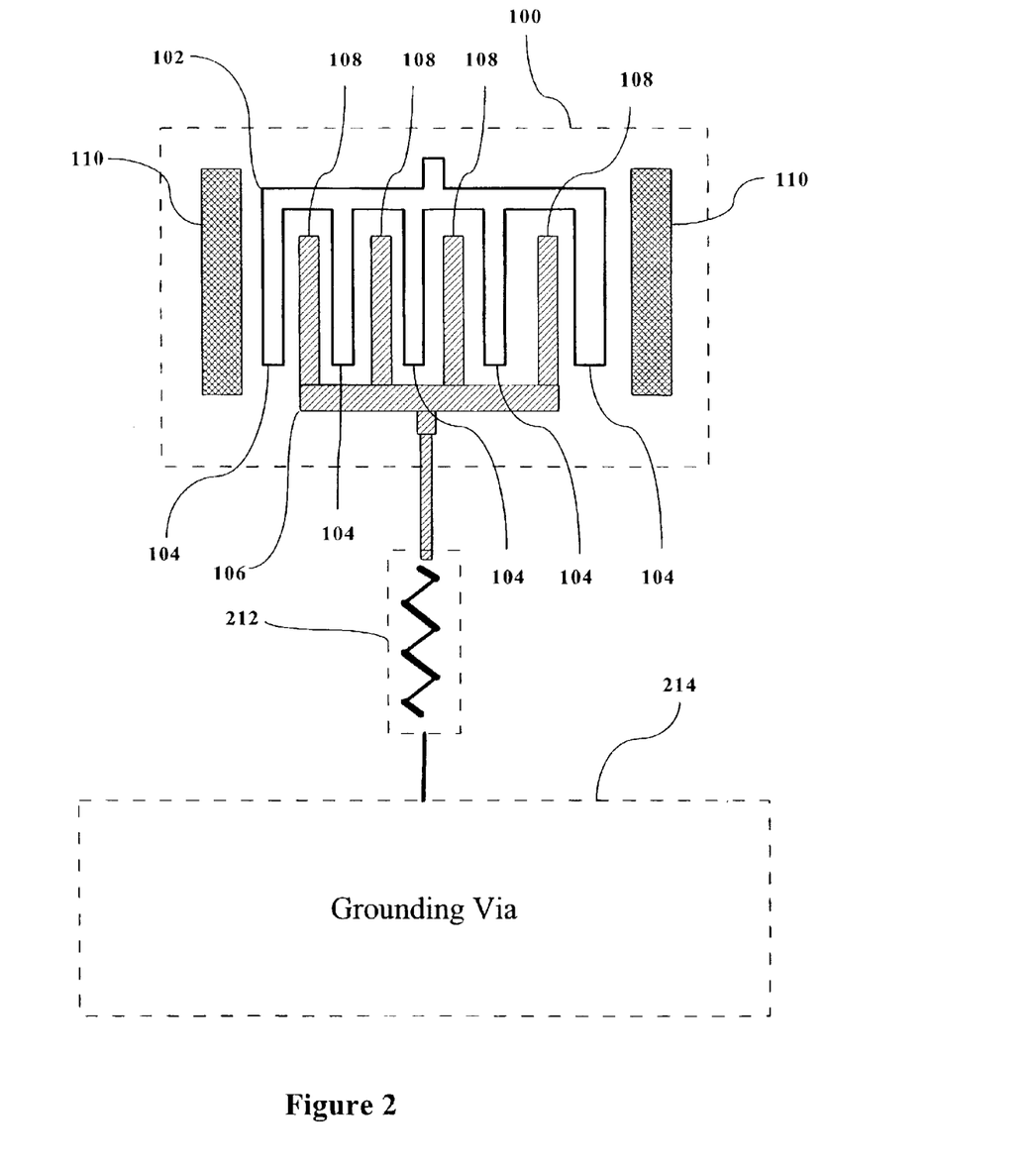
FIG. 2 illustrates the HBT of FIG. 1 configured for emitter ballasting.

FIG. 2 illustrates the HBT 100 of FIG. 1 configured for emitter ballasting according to the prior art. As shown in FIG. 2, the common emitter 106 is coupled to an emitter ballast (e.g., a resistor) 212 which in turn is coupled to a grounding via 214. As is well known, when an external base emitter voltage $V_{EB}$ is applied to an HBT cell, a base current flows into the HBT cell to the emitter 106, configured as in FIG. 2, and will flow through emitter ballast 212 and to grounding via 214. When the collector current flows to the emitter (which is 60–120 times larger than the base current), the HBT cell heats up and tries to draw more collector current. The use of the emitter ballast 212 for each HBT in an array will slightly reduce the voltage across the base-emitter junction of the HBTs when a particular HBT tries to draw more current than the surrounding ballasted HBTs. This negative feedback mechanism compensates for the positive temperature coefficient of HBTs (which is unstable positive feedback) and forces a nearly uniform current distribution among the HBTs, thereby reducing the likelihood of the occurrence of a runaway condition. The grounding via 214, in addition to providing a grounding location, also serves to dissipate and spread some of the heat generated by the base emitter junction of HBT 100. Ideally, grounding via 214 is located as close as possible to the base emitter junction of HBT 100 to maximize the dissipating effect of the grounding via. However, the emitter ballast 212 is situated between the emitter electrode and the grounding via 214, thus preventing the locating of the grounding via 214 immediately adjacent to the HBT 100, where it would maximize the dissipation effect.

Figure 3:
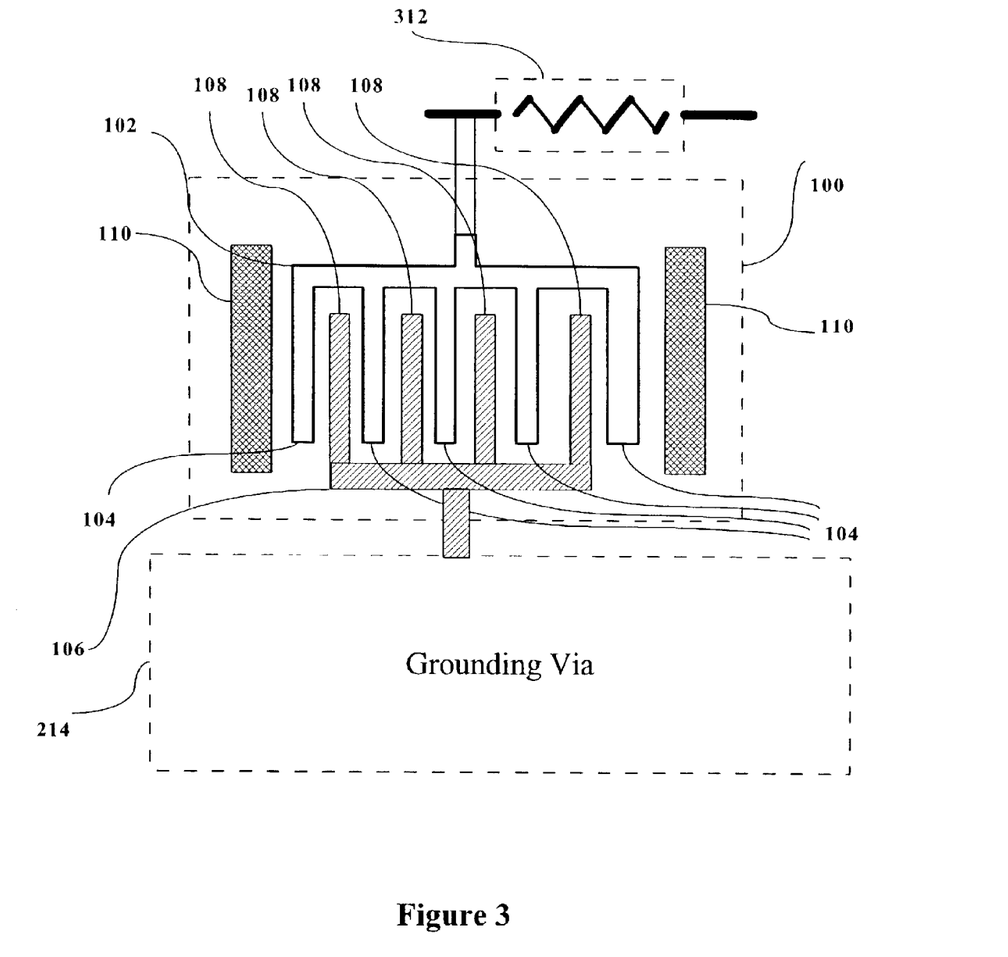
FIG. 3 illustrates the HBT of FIG. 1 in a base-ballasted configuration.

FIG. 3 illustrates the HBT 100 of FIG. 1 in a base-ballasted configuration according to the prior art. As shown in FIG. 3, a base ballast 312 is connect to the base 102. Since there is no ballast located near the emitter electrode, the grounding via 214 is situated immediately adjacent to the HBT 100. In this manner, the HBT gains the benefit of ballasting (base ballast 312) and has the additional benefit that its base emitter junction is located very close to the grounding via 214, thereby maximizing the dissipation effect of the grounding via. Further, the base ballasted HBT in FIG. 3 benefits from not having collector-emitter voltage dropped across an emitter ballast resistor, which degrades the ability of the HBT cell to convert DC power to RF power, lowering the RF output power and efficiency.

Figure 4:
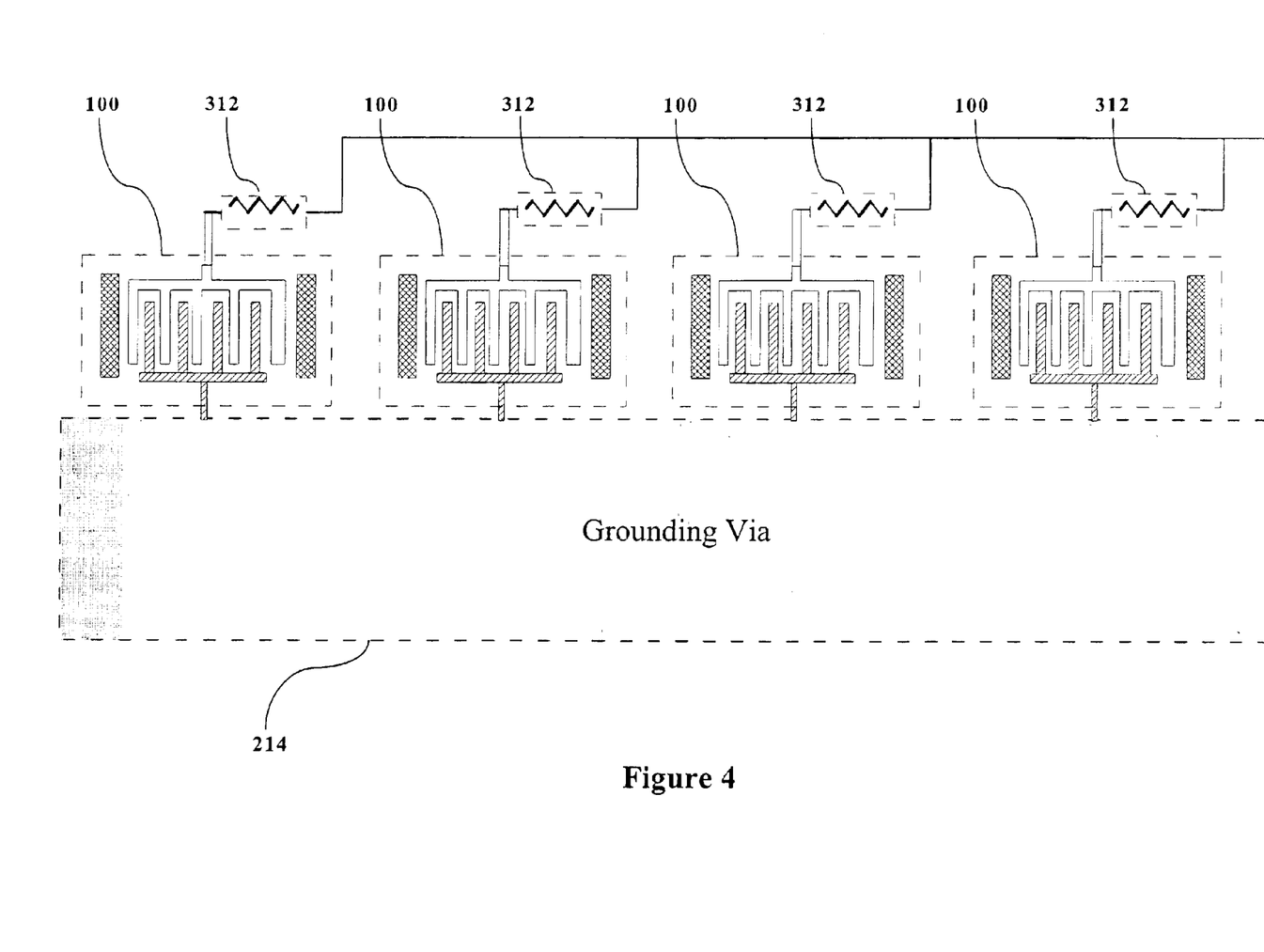
FIG. 4 illustrates the standard linear array of base ballasted HBTs embodied in the prior art.

FIG. 4 illustrates a conventional configuration for a linear HBT array having base ballasted HBTs. A series of HBTs 100 are arranged linearly (directly side-by-side, uniformly aligned as shown), having their emitters connected to grounding via 214. Coupled to the base of each HBT 100 is a ballasting resistor 312 as shown. As discussed above, each HBT is spaced apart from its adjacent HBT by a predetermined distance, typically 40–50 $\mu$m. The HBTs cannot effectively be moved closer together, as doing so will increase the thermal coupling effect of one on the other.

The base, emitter, and collector fingers of HBT's in an array are typically parallel, due to the effect of crystal orientation on the etching rates of specific epitaxial materials and the ability to form junctions and deposit metal in the formation of contacts. Thus, as shown by the dashed lines in FIG. 1, typical HBTs are essentially rectangular in shape, defined by two parallel sides (left and right dashed lines in FIG. 1) and a parallel top and bottom (top and bottom dashed lines in FIG. 1). Further, a typical HBT has a collector finger situated along each of the two parallel sides, with the base and emitter fingers situated between the outer collectors, also as shown in FIG. 1. Variations of this arrangement are known (e.g., the use of a round base and a horseshoe-shaped emitter around the base, with collectors on the sides) and it is understood that the novel aspects of the present invention are applicable to such variations.

Figure 5:
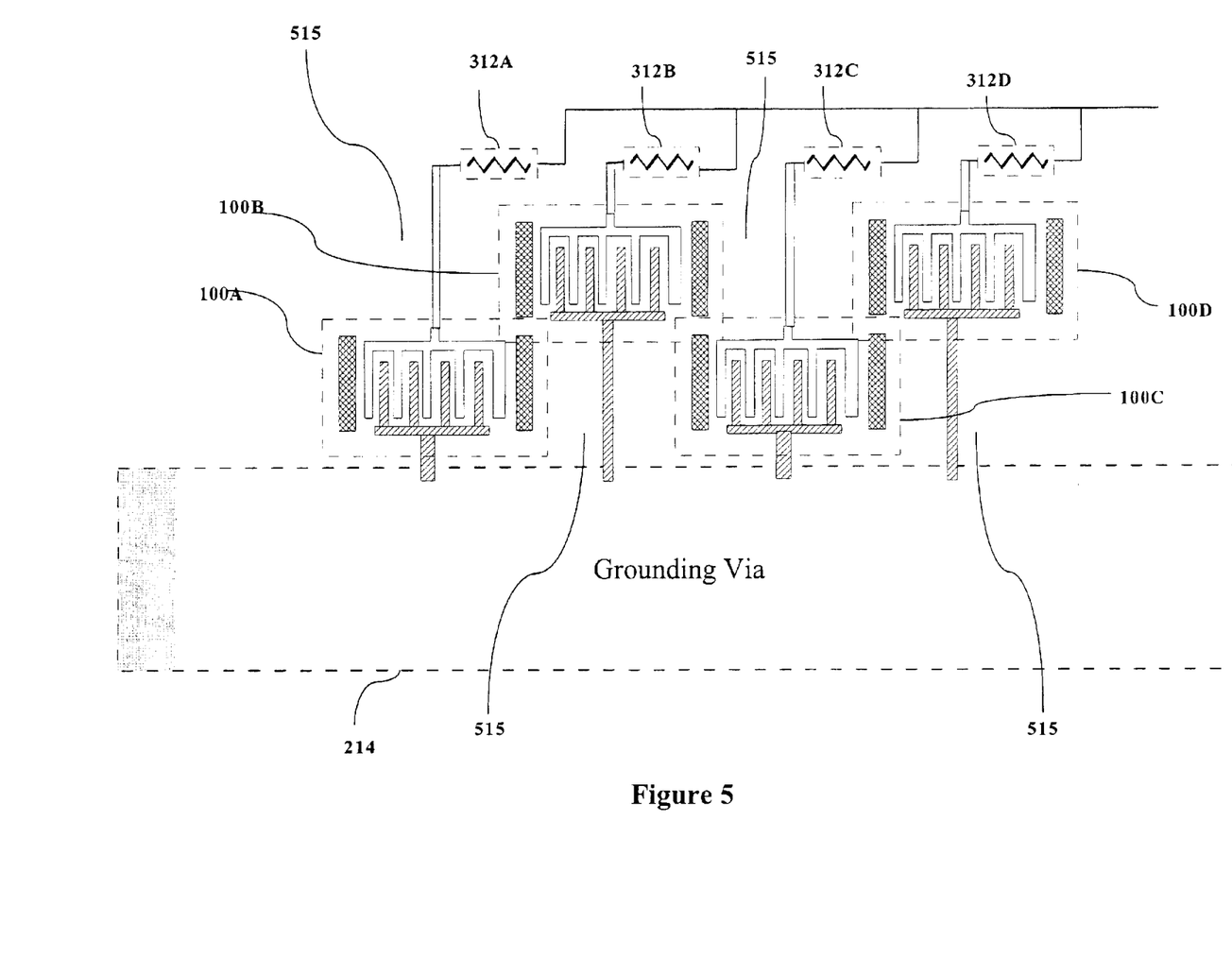
FIG. 5 illustrates a nonlinear (staggered) base ballasted HBT array in accordance with the present invention, configured for power amplification.
Figure 6:
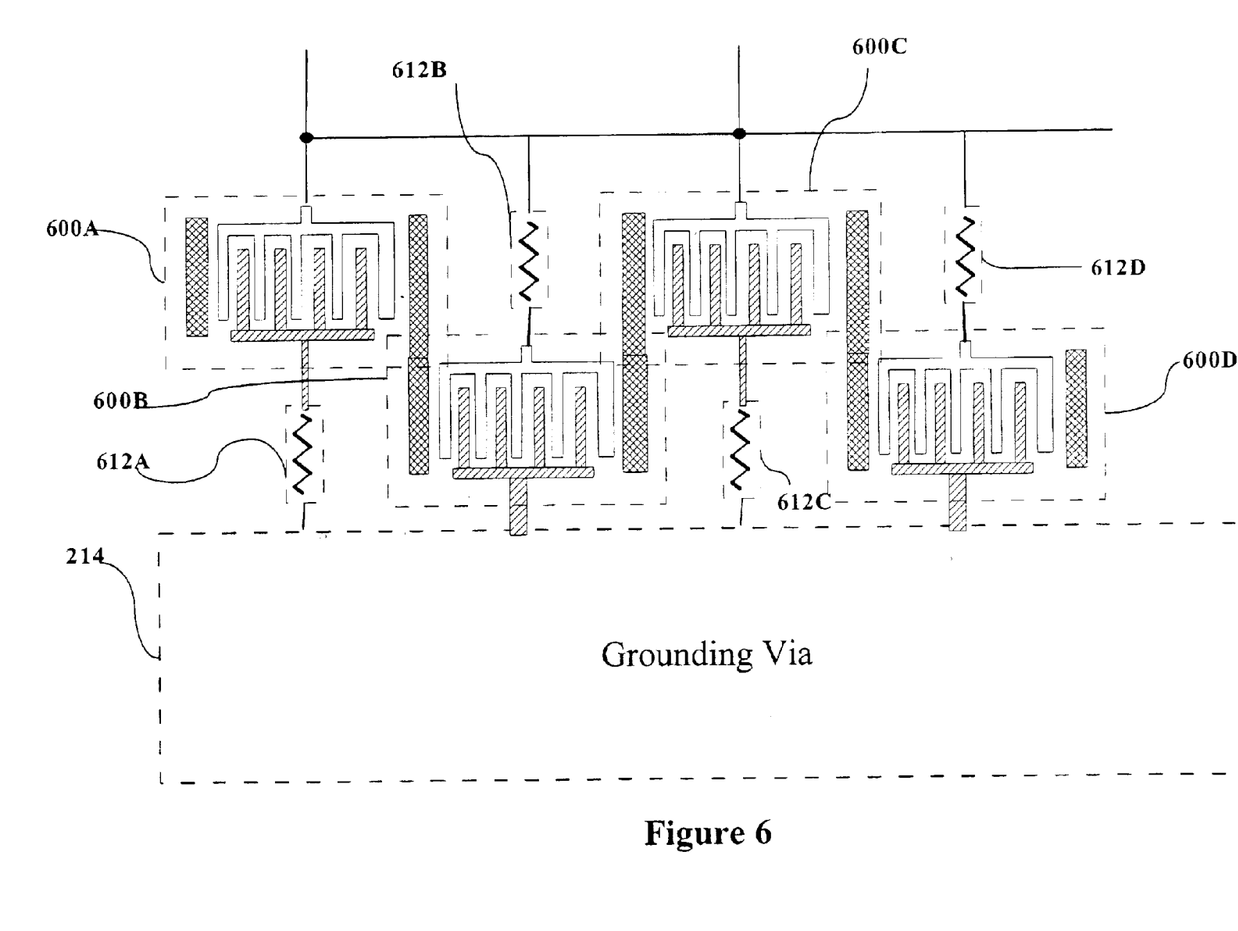
FIG. 6 illustrates a preferred embodiment of the present invention, a nonlinear array of HBT cells incorporating a mixed or dual ballasting configuration.
Figure 7:
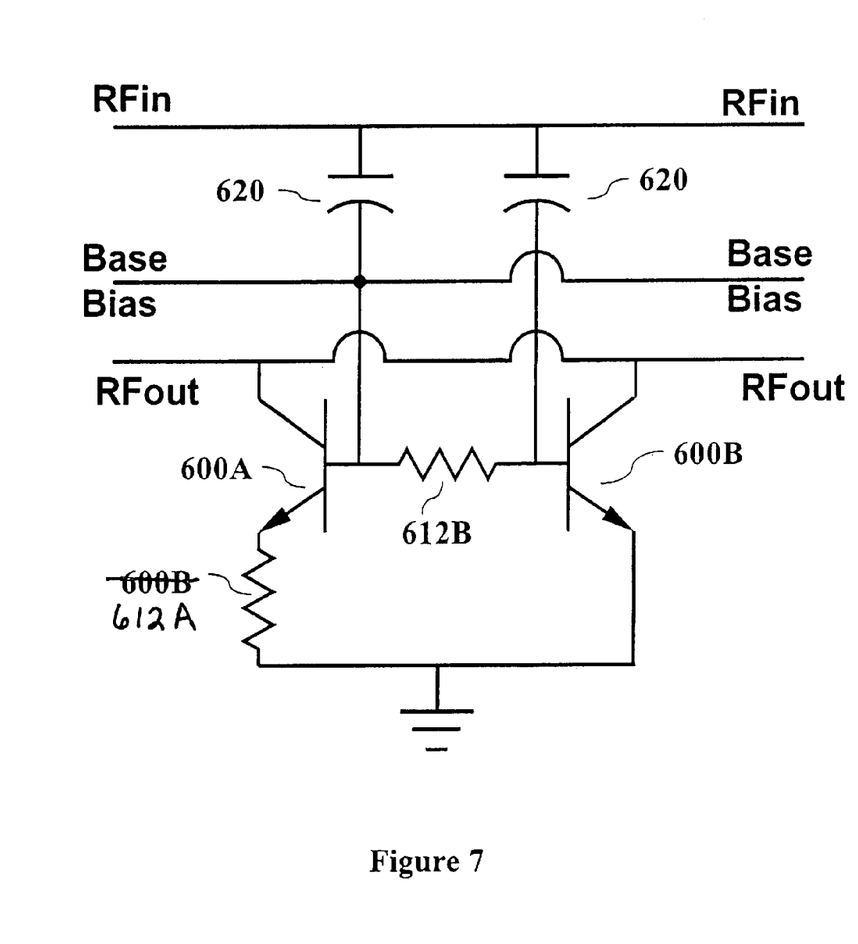
FIG. 7 illustrates a circuit schematic of the most preferred embodiment of this invention as would be used in a typical power amplifier configuration.

FIGS. 5–7 illustrate alternative embodiments of the present invention. In the discussion of the present invention, the following terms have the following meanings:

"Staggered arrangement" means that a first HBT is not in a direct side-by-side relationship with an adjacent HBT. In contrast to the prior art linear arrangement, where the facing relationship of adjacent sides of adjacent HBTs is complete (i.e., essentially the entire length of the side of one of the HBTs is in a facing relationship with the adjacent side of the adjacent HBT), in a "staggered arrangement", neither of the adjacent sides of the adjacent HBTs are in a complete facing relationship with the other and, in fact, may not be in a facing relationship at all;

"one-up/one-down staggering" means that the HBTs are staggered such that, relative to a vertical plane, the relationship between the adjacent HBTs is such that they are alternated so that a first HBT is considered in an "up" position relative to the second HBT, the second HBT is considered in a "down" position relative to the third HBT, the third HBT is considered in an "up" position relative to the fourth HBT, . . . etc, as shown in for example, FIGS. 5 and 6;

"corner-to-corner staggering" means that neither of the adjacent sides of adjacent HBTs are in a facing relationship with the other, but one of the corners of one of the adjacent HBTs is close to or overlapping one of the corners of the other of the adjacent HBTs, preferably as close as possible without violating design rules which define the allowable spacing between adjacent HBTs. HBTs in an array can be considered both "corner-to-corner staggered" and "one-up/one-down staggered" at the same time, as illustrated in FIGS. 5 and 6.

FIG. 5 illustrates a nonlinear (staggered) base ballasted HBT array configured for power amplification. The collectors are aligned in this embodiment for maximum reduction in area needed for power amplification requirements. As can be seen in FIG. 5, rather than being in a linear arrangement, the HBTs of the present invention are staggered, i.e., nonlinear, and the pitch (the distance between a fixed point between two identical HBTs) has been reduced to less than the width of the HBT cell itself. The extra distance between HBTs needed in a linear array to minimize electrical leakage and thermal coupling, as shown in FIG. 4, is no longer required when using the staggered array, as shown in FIG. 5. Specifically, HBTs 100A and 100C are in essentially the same position relative to grounding via 214, while HBTs 100B and 100D are spaced away from grounding via 214.

This forms unused inactive areas 515 (the significance of which will be apparent in the discussion of a preferred embodiment illustrated below with respect to FIG. 6). Further, the HBTs of FIG. 5 "overlap" each other, i.e., the right collector of HBT 100A and the left collector of HBT 100B are aligned along an imaginary vertical axis bisecting both collectors, and the remaining HBTs are aligned accordingly as shown. In this manner, while there can be a slight increase in size in the vertical direction because the array of HBT cells is now staggered, the staggered array itself is significantly more compact in the horizontal direction because of the elimination of the large pitch between the individual HBT cells in a linear array, and suffers no degradation in overall thermal resistance of the combined HBT cells when forming an output stage of a power amplifier.

As can be seen, in this configuration, the HBTs are all base-biased. Although the staggered array of HBT cells causes one cell to be slightly farther away from grounding vias than its partner cell, they are still close enough to the grounding vias such that there is minimal effect on operating electrical and thermal performance. However, for increased efficiency of operation, the ballast resistance in the HBT cell that are further away from the grounding via (100B and 100D in this example), can be selected to be slightly higher (e.g., by 2–3% when scaled by the current gain, β, of the HBT) than that of the partner HBT cells (100A and 100C).

The configuration of FIG. 5, when used in a power amplifier, operates well and reduces the horizontal footprint of the HBT array (and thus the power amplifier size) considerably. The effect of thermal coupling from one HBT to another is minimized. Unlike the FIG. 4 configuration, where the entire right side of one HBT is adjacent to (i.e., in complete facing relationship with) the entire left side of its adjacent HBT, in the FIG. 5 configuration, only the corners of adjacent HBTs are in close proximity to each other, and the footprint of the HBTs overlap each other. Thus, the HBT array of FIG. 5 illustrates a corner-to-corner, one-up/one-down staggered arrangement in accordance with the present invention. As a result of using this configuration, the majority of the HBT perimeter is surrounded by inactive, high resistivity GaAs. Thus the heat generated by an HBT has minimal effect on adjacent HBTs because the heat can be more effectively shunted through the thickness of the chip to the die attach material, which is typically a silver-loaded epoxy or solder, and packaging with minimal coupling to adjacent HBT cells.

FIG. 6 illustrates a preferred embodiment of the present invention, which offers the greatest reduction in area needed for implementing a power amplifier compared to using the standard linear array of HBT cells. This embodiment introduces the concept of "mixed-ballasting", whereby the HBTs that are further away from the grounding via (600A and 600C) are emitter-ballasted, while the HBTs that are closer to the grounding via (600B and 600D) are base-ballasted. In a preferred embodiment, there are N HBTs (N being an even positive integer greater than 1) in the array and the HBTs are paired into N/2 HBT pairs. Specifically, referring to FIG. 6, HBT 600A and HBT 600C are emitter ballasted rather than base biased as shown in FIG. 5. A primary advantage to this configuration is that the ballasting resistors 612A and 612C can be situated in the otherwise unused area 515 between the emitters of HBT 600A and 600C and the grounding via 214. In addition, the ballasting resistors 612B and 612D, which are associated with HBTs 600B and 600D, respectively, can be situated in the otherwise unused area 515 above their associated HBTs. This further reduces the amount of space used for the resistors, thereby giving the designer the same level of performance as in prior art HBT arrays, but in a significantly reduced footprint.

In addition to the above modifications, the adjacent HBTs in FIG. 6 also have common collectors, i.e., the collectors of adjacent HBTs are combined into a single collector spanning adjacent HBTs as shown. This simplifies fabrication and allows the HBTs to be placed as close as possible to each other, minimizing the footprint of the HBT array.

FIG. 7 is a circuit diagram showing the HBT pair 600A and 600B of FIG. 6, configured as a segment of a power amplifier. Referring to FIG. 7, the values of the emitter ballast resistor 600B and base ballast resisitor 612B are related to each other by the current gain, Beta (β), of the HBT process. The RF input power is fed to the base and emitter ballasted cells through segmented capacitors 620, which in a preferred embodiment are typically 0.2 to 0.5 pF each for applications under 2 GHz. The HBT's used to form the dual ballasted cell as shown in FIG. 7, each typically have emitter areas ranging from 90 to 500 $\mu m^2$ with 2, 3 or 4 emitter-finger configurations. The base bias is fed from an external source/supply directly to the base of the emitter ballasted cell and into the ballast resistor of the base ballasted HBTs. Both base and emitter ballasted HBTs should achieve the same current density for a given externally applied base bias. The collector bias is fed from a common bus that spans all the collectors in the HBT array. An HBT array as described above results in a more compact design, without losing any performance (electrical or thermal) or functionality.

It should be understood that the foregoing is illustrative and not limiting and obvious modifications may be made by those skilled in the art without departing from the spirit of the invention. For example, while the illustrations portray an array comprising four HBTs, it is understood that any number of HBT pairs can be used according to power amplification needs, in an array and still fall within the scope of the claimed invention. Likewise, while in the above examples the one-up/one-down staggered HBT pairs are shown and described as being situated corner-to-corner, it is understood that simply staggering the HBTs will result in increased inactive areas around the HBTs and thus allow the HBTs to be moved closer together to achieve some, though not all, of the benefits of the preferred embodiments. In addition, instead of using the one-up/one-down staggered arrangement, any arrangement whereby the HBTs are staggered to effect less than complete facing relationship between sides of adjacent HBTs will serve to increase the amount of inactive material adjacent to the active material of the HBT and such arrangements are thus considered within the scope of the present invention. Accordingly, the specification is intended to cover such alternatives, modifications, and equivalence as may be included within the spirit and scope of the invention as defined in the following claims.

What is claimed is:

1. An improved HBT circuit configuration having N HBTs, where N is an even positive integer >b 1,the improvement comprising:

said N HBTs being formed in a non-linear configuration and arranged in pairs, whereby adjacent HBTs in each pair are in a staggered and mixed-ballasted arrangement with respect to each other.

2. The improved HBT circuit configuration of claim 1, wherein said non-linear configuration comprises a corner-to-corner staggered arrangement.

3. The improved HBT circuit configuration of ciaim 2, wherein said corner-to-corner staggered arrangement comprises a one-up/one-down corner-to-corner staggering arrangement.

4. The improved HBT circuit configuration of claim 1, wherein said N HBTs are paired into N/2 pairs, each of said N/12 pairs comprising a one-up/one-down staggered pair.

5. The improved HBT circuit configuration of claim 1, wherein said N HBTs are paired into N/2 pairs, each of said N/2 pairs comprising a one-up/one-down corner-to-corner staggered pair.

6. An improved HBT circuit configuration having N HBTs, where N is an even positive integer >1, the improvement comprising:

said N HBTs being formed in a non-linear configuration, wherein:

adjacent HBTs are in a staggered arrangement with respect to each other;

said N HBTs are paired into N/2 pairs, each of said N/2 pairs comprising a one-up/one-down corner-to-corner staggered pair;

each of said N/2 pairs comprises a first HBT and a second HBT; and each of said N/2 pairs is configured so that a collector of said first HBT is aligned with a collector of said second HBT.

7. The improved HBT circuit of claim 6, wherein each of said N/2 pairs is ballasted using mixed-ballasting.

8. An improved HBT circuit configuration having N HBTs, where N is an even positive integer >1, the improvement comprising:

said N HBTs being formed in a non-linear configuration, wherein:

adjacent HBTs are in a staggered arrangement with respect to each other;

said N HBTs are paired into N/2 pairs, each of said N/2 pairs comprising a one-up/one-down corner-to-corner staggered pair;

each of said N/2 pairs comprises a first HBT and a second HBT; and each of said N/2 pairs is configured so that a collector of said first HBT is common with a collector of said second HBT.

9. The improved HBT circuit of claim 8, wherein each of said N/2 pairs is ballasted using mixed-ballasting.

10. An improved HBT circuit configuration having N HBTs, where N is an even positive integer >1, the improvement comprising:

said N HBTs being formed in a non-linear configuration, wherein:

adjacent HBTs are in a staggered arrangement with respect to each other;

said N HBTs are paired into N/2 pairs, each of said N/12 pairs comprising a one-up/one-down corner-to-corner staggered pair; and each of said N/2 pairs is ballasted using mixed-batlasting.

11. An improved HBT array comprising:

a plurality of HBTs, each having plural sides, said HBTs being arranged in pairs and in a staggered arrangement so that adjacent sides of adjacent HBTs in each pair have a facing relationship that is less than complete and the HBTs in each pair are mixed-ballasted.

12. The improved HBT array of claim 11, wherein the facing relationship between one of said sides of a first of said HBTs and an adjacent side of an adjacent HBT is less than approximately 50% of the length of said one of said sides of said first HBTs.

13. The improved HBT array of claim 12, wherein the facing relationship between one of said sides of a first of said HBTs and an adjacent side of an adjacent HBT is less than approximately 40% of the length of said one of said sides of said first HBTs.

14. The improved HBT array of claim 13, wherein the facing relationship between one of said sides of a first of said HBTs and an adjacent side of an adjacent HBT is less than approximately 30% of the length of said one of said sides of said first HBTs.

15. The improved HBT array of claim 14, wherein the facing relationship between one of said sides of a first of said HBTs and an adjacent side of an adjacent HBT is less than approximately 20% of the length of said one of said sides of said first HBTs.

16. The improved HBT array of claim 15, wherein the facing relationship between one of said sides of a first of said HBTs and an adjacent side of an adjacent HBT is less than approximately 10% of the length of said one of said sides of said first HBTs.

17. The improved HBT array of claim 16, wherein the facing relationship between one of said sides of a first of said HBTs and an adjacent side of an adjacent HBT is less than approximately 5% of the length of said one of said sides of said first HBTs.

18. The improved HBT array of claim 17, wherein the facing relationship between one of said sides of a first of said HBTs and an adjacent side of an adjacent HBT is approximately zero.

* * * * *